United States Patent
Rowell et al.

(10) Patent No.: US 10,591,524 B2
(45) Date of Patent: Mar. 17, 2020

(54) MEASURING DEVICE AND MEASURING METHOD WITH MULTI-BEAM BEAMFORMING

(71) Applicant: Rohde & Schwarz GmbH & Co. KG, Munich (DE)

(72) Inventors: Corbett Rowell, Munich (DE); Adam Tankielun, Ottobrunn (DE); Hendrik Bartko, Unterhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 170 days.

(21) Appl. No.: 15/676,578

(22) Filed: Aug. 14, 2017

(65) Prior Publication Data
US 2019/0049501 A1    Feb. 14, 2019

(51) Int. Cl.
*G01R 27/08* (2006.01)
*G01R 29/08* (2006.01)

(52) U.S. Cl.
CPC .............................. *G01R 29/0878* (2013.01)

(58) Field of Classification Search
CPC ........................... G01R 29/0878; G01R 29/08
USPC ...................................................... 324/603
See application file for complete search history.

(56) References Cited

U.S. PATENT DOCUMENTS

| 9,794,009 B1* | 10/2017 | Olgaard | H04B 17/29 |
| 2006/0022884 A1* | 2/2006 | Hayashi | H01Q 3/2623 |
| | | | 343/757 |
| 2009/0100476 A1 | 4/2009 | Frisco et al. | |
| 2011/0109507 A1* | 5/2011 | Warnick | H01O 21/0025 |
| | | | 342/368 |
| 2012/0299765 A1* | 11/2012 | Huang | H01Q 3/24 |
| | | | 342/81 |
| 2014/0273873 A1* | 9/2014 | Huynh | H04B 17/29 |
| | | | 455/67.12 |
| 2017/0026961 A1* | 1/2017 | Hahn, III | H04B 7/2615 |

FOREIGN PATENT DOCUMENTS

CN        102751592 B      3/2015

* cited by examiner

*Primary Examiner* — Melissa J Koval
*Assistant Examiner* — Courtney G McDonnough
(74) *Attorney, Agent, or Firm* — Ditthaving & Steiner, P.C.

(57) ABSTRACT

A measuring device comprising a plurality of analog signal adjusters, and an antenna array, comprising a plurality of antennas is provided. Each of the plurality of antennas is connected to exactly one of the plurality of analog signal adjusters. The analog signal adjusters are adapted to alter the phase and/or amplitude of signals sent and/or received by the plurality of antennas, generating an antenna characteristic of the antenna array comprising at least a first beamforming beam or a first plane wave and a second beamforming beam or a second plane wave.

16 Claims, 4 Drawing Sheets

MEASURING DEVICE AND MEASURING METHOD WITH MULTI-BEAM BEAMFORMING

TECHNICAL FIELD

The invention relates to a measuring device and a measuring method which employ beamforming in an antenna array.

BACKGROUND ART

In recent years, beamforming has come into widespread use. When performing beamforming, the individual signals of the antennas of an antenna array are generated so that a directional characteristic of the antenna array is achieved. A distinctive beam of the directional characteristic can thereby be achieved. For example the document US 2012/0299765 A1 shows such a beamforming.

When performing measurements on a device under test, it is useful to be able to measure a directional characteristic of the device under test and especially to test the capabilities of the device under test in this regard. Especially for large devices under test, possibly having more than one transmitter and/or receiver, it is useful to be able to target the entire surface of the device under test.

Accordingly, there is a need to provide a measuring device and a measuring method, which allow for a high flexibility, especially in a spatial sense, with regard to the measurements.

SUMMARY OF THE INVENTION

According to a first aspect of the invention, a measuring device comprising a plurality of analog signal adjusters, and an antenna array, comprising a plurality of antennas is provided. Each of the plurality of antennas is connected to exactly one of the plurality of analog signal adjusters. The analog signal adjusters are adapted to alter the phase and/or amplitude of signals sent and/or received by the plurality of antennas, generating an antenna characteristic of the antenna array comprising at least a first beamforming beam or a first plane wave and a second beamforming beam or a second plane wave. It is thereby possible to measure two different aspects on the device under test, simultaneously. Also, it is possible to for example to transmit signals towards the device under test from two different directions at the same time.

According to a first preferable implementation form of the first aspect, the measuring device further comprises a controller, adapted to control an amount of phase shift and/or an amount of amplitude shift generated by the analog signal adjusters. This allows for a very simple setting of the antenna characteristic of the antenna array.

According to a second preferable implementation form of the first aspect, the measuring device is adapted to hold a device under test at a position with regard to the antenna array, in which the device under test is in a nearfield of the antenna array. The analog signal adjusters are adapted to adjust the phase and/or amplitude of the signals sent and/or received by the plurality of antennas, so that the device under test experiences farfield conditions with regard to the antenna array. This allows for a very small measuring setup.

According to a third preferable implementation form of the first aspect, a first group of analog signal adjusters of the plurality of analog signal adjusters forms a first power distribution network. The first power distribution network is adapted to adjust the phases and/or amplitudes in order to generate the first beamforming beam or first plane wave. A second group of analog signal adjusters of the plurality of analog signal adjusters forms a second power distribution network. The second power distribution network is adapted to adjust the phases and/or amplitudes in order to generate the second beamforming beam or second plane wave. This allows for a very simple parallel generating of two different directional characteristics of the antenna array.

According to a fourth preferable implementation form of the first aspect, the measuring device comprises a first signal generator. The first signal generator is adapted to generate a first measuring signal, and supply it to the plurality of analog signal adjusters. The analog signal adjusters are adapted to alter the phases and/or amplitudes of the first measuring signal, generating a transmission antenna characteristic of the antenna array comprising at least the first beamforming beam or first plane wave and the second beamforming beam or second plane wave. This allows for a very simple measurement of the reception capabilities of the device under test.

According to a fifth preferable implementation form of the first aspect, the measuring device comprises a first signal generator and a second signal generator. The first signal generator is adapted to generate a first measuring signal and supply it to a first group of analog signal adjusters of the plurality of analog signal adjusters. The second signal generator is adapted to generate a second measuring signal and supply it to a second group of analog signal adjusters of the plurality of analog signal adjusters. The first group of analog signal adjusters is adapted to alter the phases and/or amplitudes of the first measuring signal, generating a transmission antenna characteristic of the antenna array comprising at least the first beamforming beam or the first plane wave. The second group of analog signal adjusters is adapted to alter the phases and/or amplitudes of the second measuring signal generating a transmission antenna characteristic of the antenna array comprising at least the second beamforming beam or the second plane wave. This allows for transmitting two different signals towards the device under test simultaneously by the two different groups of analog signal adjusters.

According to a sixth preferable implementation form of the first aspect, the measuring device comprises a first signal analyzer, which is adapted to measure a first measuring signal supplied to it by the plurality of analog signal adjusters. The analog signal adjusters are then adapted to alter the phases and/or amplitudes of the first measuring signal, generating a reception antenna characteristic of the antenna array comprising at least the first beamforming beam or first plane wave and the second beamforming beam or second plane wave. This allows for a very simple implementation of a measurement of the transmission capabilities of the device under test.

According to a seventh preferable implementation form of the first aspect, the measuring device comprises a first signal analyzer and a second signal analyzer. The first signal analyzer is adapted to measure a first measuring signal, provided to it by a first group of analog signal adjusters of the plurality of signal adjusters. The second signal analyzer is adapted to measure a second measuring signal provided to it by a second group of analog signal adjusters of the plurality of signal adjusters. The first group of analog signal adjusters is adapted to alter the phases and/or amplitudes of the first measuring signal, generating a reception antenna characteristic of the antenna array comprising at least the first beamforming beam or the first plane wave. The second group of analog signal adjusters is adapted to alter the phases and/or amplitudes of the second measuring signal generating a reception antenna characteristic of the antenna array comprising at least the second beamforming beam or the second plane wave. It is thereby possible to receive two differently directed signals from the device under test simultaneously.

According to an eighth preferable implementation form of the first aspect, the measuring device comprises either a first signal generator and a second signal generator or a first signal analyzer and a second signal analyzer. The measuring device comprises a switching matrix connected to the plurality of signal adjusters. In case of the measuring device comprising the first signal generator and the second signal generator, the switching matrix is additionally connected to them. In case the measuring device comprises the first signal analyzer and the second signal analyzer, the switching matrix is connected to them. By use of the switching matrix, it is possible to dynamically assign the individual analog signal adjusters and thereby individual antennas to the first signal generator, second signal generator, first signal analyzer and second signal analyzer. This allows for changing the number of analog signal adjusters and antennas allocated to each of the generators or analyzers.

According to a further preferable implementation form of the first aspect, the switching matrix is adapted to connect a first group of analog signal adjusters of the plurality of analog signal adjusters to the first signal generator, and a second group of analog signal adjusters of the plurality of analog signal adjusters to the second signal generator, if the measuring device comprises the first signal generator and the second signal generator. Moreover, the switching matrix is adapted to connect the first group of signal adjusters of the plurality of analog signal adjusters to the first signal analyzer and the second group of analog signal adjusters of the plurality of analog signal adjusters to the second signal analyzer, if the measuring device comprises the first signal analyzer and the second signal analyzer. This allows for dynamically assigning the analog signal adjusters, as needed.

According to a further preferable implementation form of the first aspect, the switching matrix is adapted to selectively adjust a number of analog signal adjusters within the first group of analog signal adjusters and to selectively adjust a number of analog signal adjusters within the second group of analog signal adjusters. It is thereby possible to take account of different measuring needs. Especially an increased directional accuracy can be achieved by assigning more antennas and analog signal adjusters to a specific antenna group.

According to a further preferable implementation form of the first aspect, the measuring device comprises either a first signal generator, a second signal generator and a third signal generator or a first signal analyzer, a second signal analyzer and a third signal analyzer. In case that the measuring device comprising the signal generators, the switching matrix is connected to the plurality of signal adjusters and to the signal generators. In case that the measuring device comprises the signal analyzers, the switching matrix is connected to the plurality of signal adjusters and to the signal analyzers. This allows for having three different signals processed with three different directional characteristics, independently.

According to a further preferable implementation form of the first aspect, the switching matrix is adapted to connect a first group of analog signal adjusters of the plurality of analog signal adjusters to the first signal generator, a second group of analog signal adjusters to the second signal generator and a third group of analog signal adjusters to the third signal generator, if the measuring device comprises the signal generators. Moreover, the switching matrix is adapted to connect the first group of analog signal adjusters to the first signal analyzer, the second group of analog signal adjusters to the second signal analyzer and the third group of analog signal adjusters to the third signal analyzer, if the measuring device comprises the signal analyzers. This allows for handling three different sets of signals with an individual directional characteristic, each.

According to a further preferable implementation form of the first aspect, the switching matrix is adapted to selectively adjust a number of analog signal adjusters within the first group, within the second group and within the third group of analog signal adjusters. This allows a dynamic selection of the number of analog signal adjusters and thereby also antenna elements of the antenna array.

According to a further preferable implementation form, the analog signal adjusters each comprise an analog phase adjuster, adapted to adapt the phase of a signal and/or an analog amplitude adjuster adapted to adjust an amplitude of a signal. This allows for a very low group delay of the adjustments.

According to a further preferable implementation form of the first aspect, the analog phase adjusters are micromechanical devices, each adapted to adjust a physical length of transmission line. Additionally or alternatively, the analog amplitude adjusters are micromechanically adjustable attenuators. This allows for a very simple construction of the analog signal adjusters.

According to a second aspect of the invention, a measuring method is provided. The method comprises altering a phase and/or amplitude of signals sent and/or received by a plurality of antennas, generating an antenna characteristic of an antenna array comprising at least a first beamforming beam or a first plane wave and a second beamforming beam or a second plane wave. This allows for a very flexible generation of measuring signals or reception of measuring signals.

BRIEF DESCRIPTION OF THE DRAWINGS

Exemplary embodiments of the invention are now further explained by way of example only with respect to the drawings, in which.

DETAILED DESCRIPTION OF THE PREFERRED EMBODIMENTS

Figure 1:
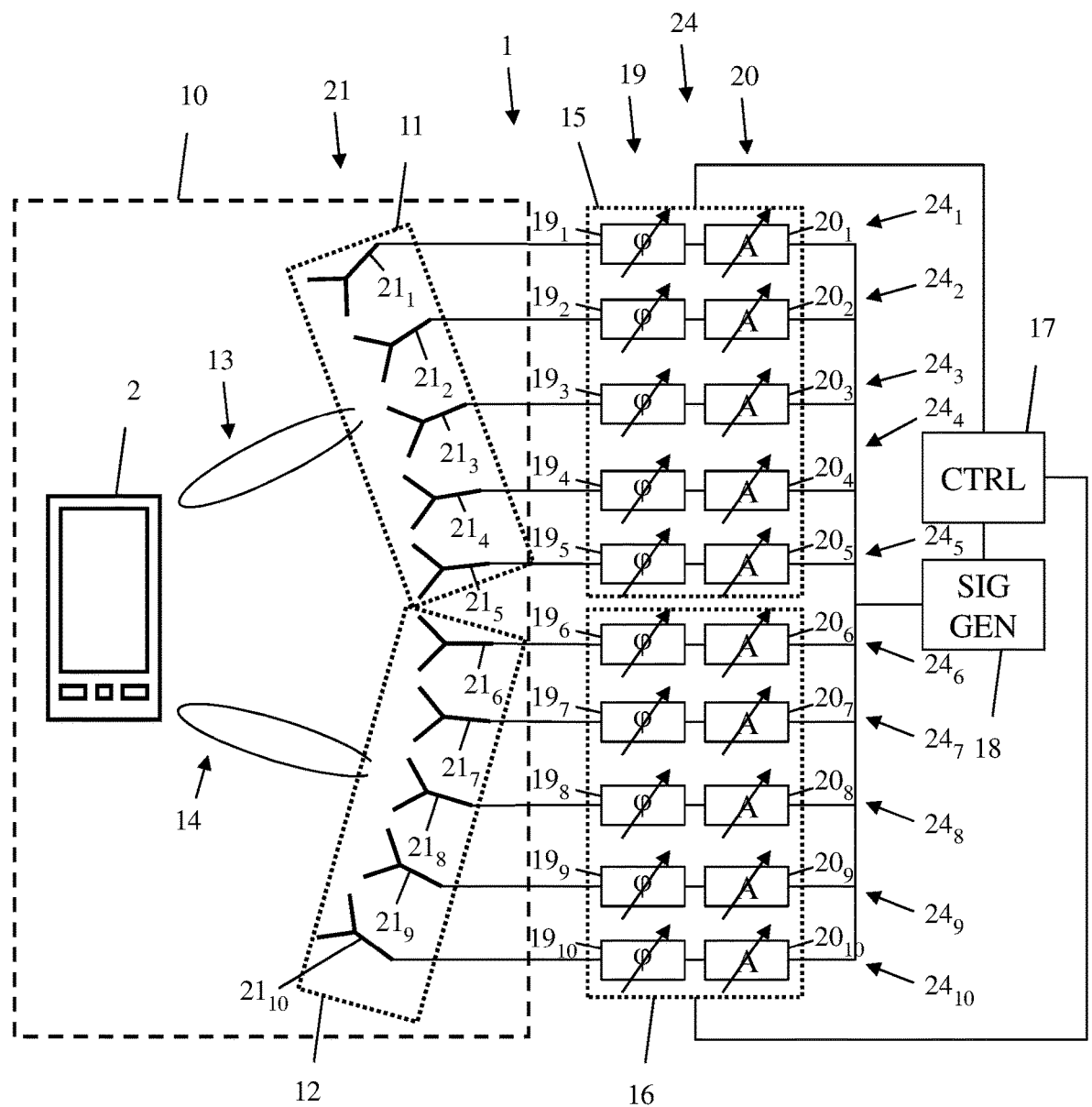
FIG. 1 shows a first embodiment of the measuring device according to the first aspect of the invention.

First we demonstrate the general construction and function along a first embodiment of the measuring device of the first aspect of the invention with regard to FIG. 1. With regard to FIG. 2 and FIG. 3, further details of alternative embodiments are described. Finally, along FIG. 4, the function of an embodiment of the inventive measuring method according to the second aspect of the invention is shown. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, a first embodiment of the measuring device 1 according to the first aspect of the invention is shown. The measuring device 1 comprises an antenna array 21 comprising a number of antennas $21_1$, $21_2$, $21_3$, $21_4$, $21_5$, $21_6$, $21_7$, $21_8$, $21_9$ and $21_{10}$. Each of these antennas $21_1$-$21_{10}$ is connected to an analog signal adjuster $24_1$, $24_2$, $24_3$, $24_4$, $24_5$, $24_6$, $24_7$, $24_8$, $24_9$ and $24_{10}$. The analog signal adjusters $24_1$-$24_{10}$ are also referred to as analog phase adjusters 24 in general. Each analog signal adjuster 24 comprises a phase adjuster $19_1$, $19_2$, $19_3$, $19_4$, $19_5$, $19_6$, $19_7$, $19_8$, $19_9$, $19_{10}$ and an analog amplitude adjuster $20_1$, $20_2$, $20_3$, $20_4$, $20_5$, $20_6$, $20_7$, $20_8$, $20_9$ and $20_{10}$. The analog phase adjusters $19_1$-$19_{10}$ are also referred to as analog phase adjusters 19 in general. The analog amplitude adjusters $20_1$-$20_{10}$ are also referred to as analog amplitude adjusters 20 in general.

Here, the analog signal adjusters $24_1$-$24_5$ form a first group of analog signal adjusters 15. The analog signal adjusters $24_6$-$24_{10}$ form a second group of analog signal adjusters 16. The first group of analog signal adjusters 15 is connected to a first group of antennas 11 of the antenna array. The second group of analog signal adjusters 16 is connected to a second group of antennas 12 of the antenna array 21.

Each of the analog signal adjusters 24 is connected to a signal generator 18, which in turn is connected to a controller 17. The controller 17 is in addition connected to the first group of analog signal adjusters 15 and the second group of analog signal adjusters 16.

When performing a measurement, the controller 17 controls the signal generator 18 to generate a first measuring signal and supply it to all of the analog signal adjusters 24. The analog signal adjusters 24 adjust the amplitude and phase of the respective signal and provide it to the respectively connected antenna $21_1$-$21_{10}$.

Especially, the analog phase adjusters 19 adjust the phase of the respective signal, while the analog amplitude adjusters 20 adjust the amplitude of the respective signals before the signals being emitted by the respectively connected antenna 21. The amount of phase adjustment and amplitude adjustment is controlled by the controller 17. The controller 17 is adapted to control the amplitude and phases so that the first group of analog signal adjusters 15 supplies signals to the first group of antennas 11, so that the first group of antennas 11 generates a first beamforming beam 13 directed towards a device under test 2. The controller 17 controls the adjustment of the amplitude and phase by the second group of analog signal adjusters 16, so that the antennas $21_6$-$21_{10}$ of the second group of antennas 12 generates a second beamforming beam 14 directed towards the device under test 2.

It is important to note that in this embodiment, all antennas 21 emit a signal comprising the same data. The signals are merely shifted with regard to their phase and amplitude in order to generate the beamforming.

Also, it is important to note that not necessarily a beamforming is performed. Also the generation of a plane wave to simulate far field conditions is possible.

Second Embodiment

Figure 2:
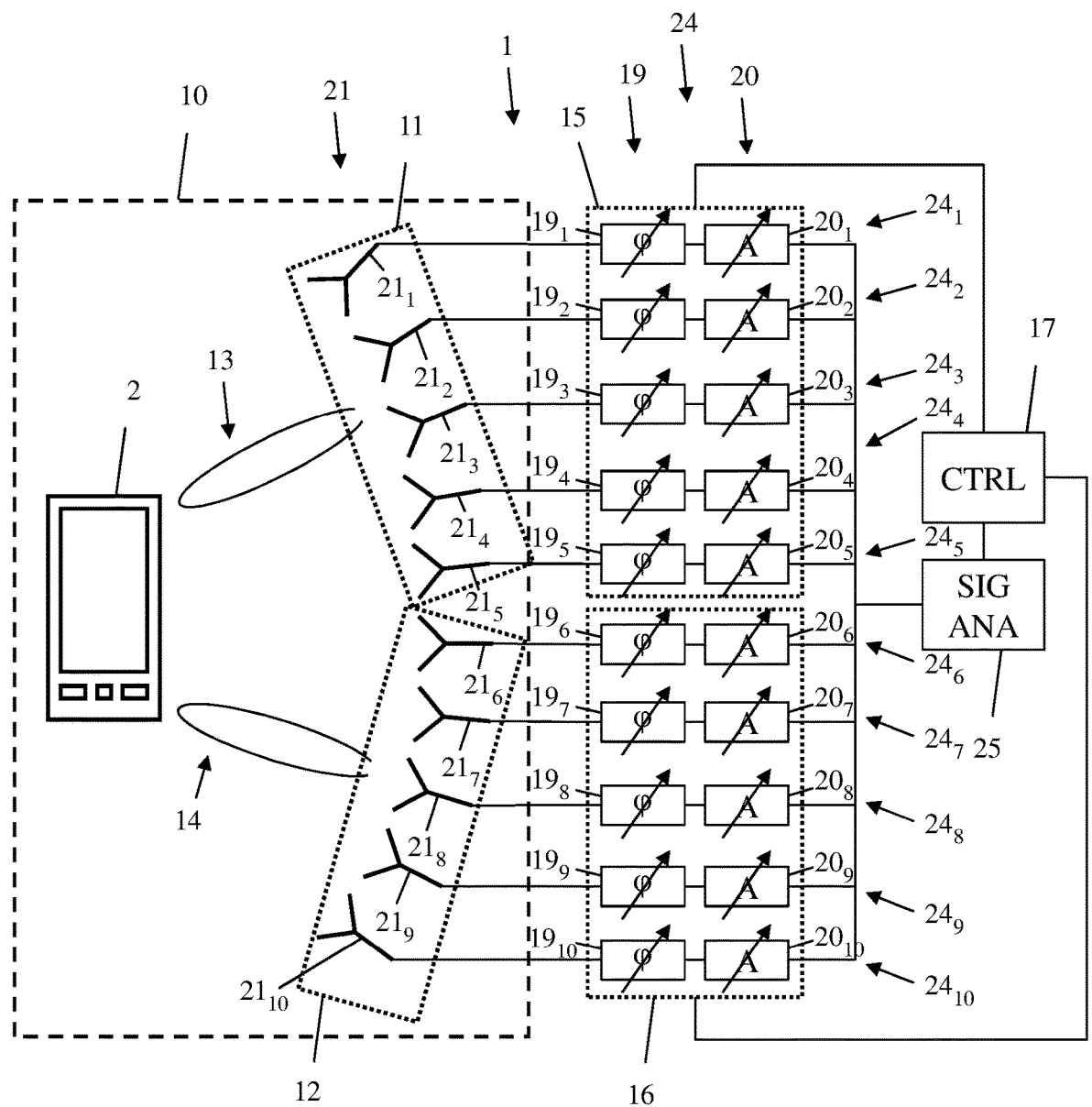
FIG. 2 shows a second embodiment of a measuring device according to the first aspect of the invention.

In FIG. 2, an alternative embodiment is shown. Here, instead of the signal generator 18, a signal analyzer 25 is depicted. Instead of generating a measuring signal and altering the phase and amplitude before transmission by the antennas 21, here the device under test 2 emits a measuring signal, which is then received by the antennas 21. The analog signal adjusters 24 adjust the phases and amplitudes so as to generate a reception antenna characteristic corresponding to the beams 13, 14, as depicted in FIG. 1. It is important to note, that since only a single signal analyzer 25 is present here, and the signals of all antennas $21_1$-$21_{10}$ are added up, it is only possible to receive a single data signal and analyze it.

Third Embodiment

Figure 3:
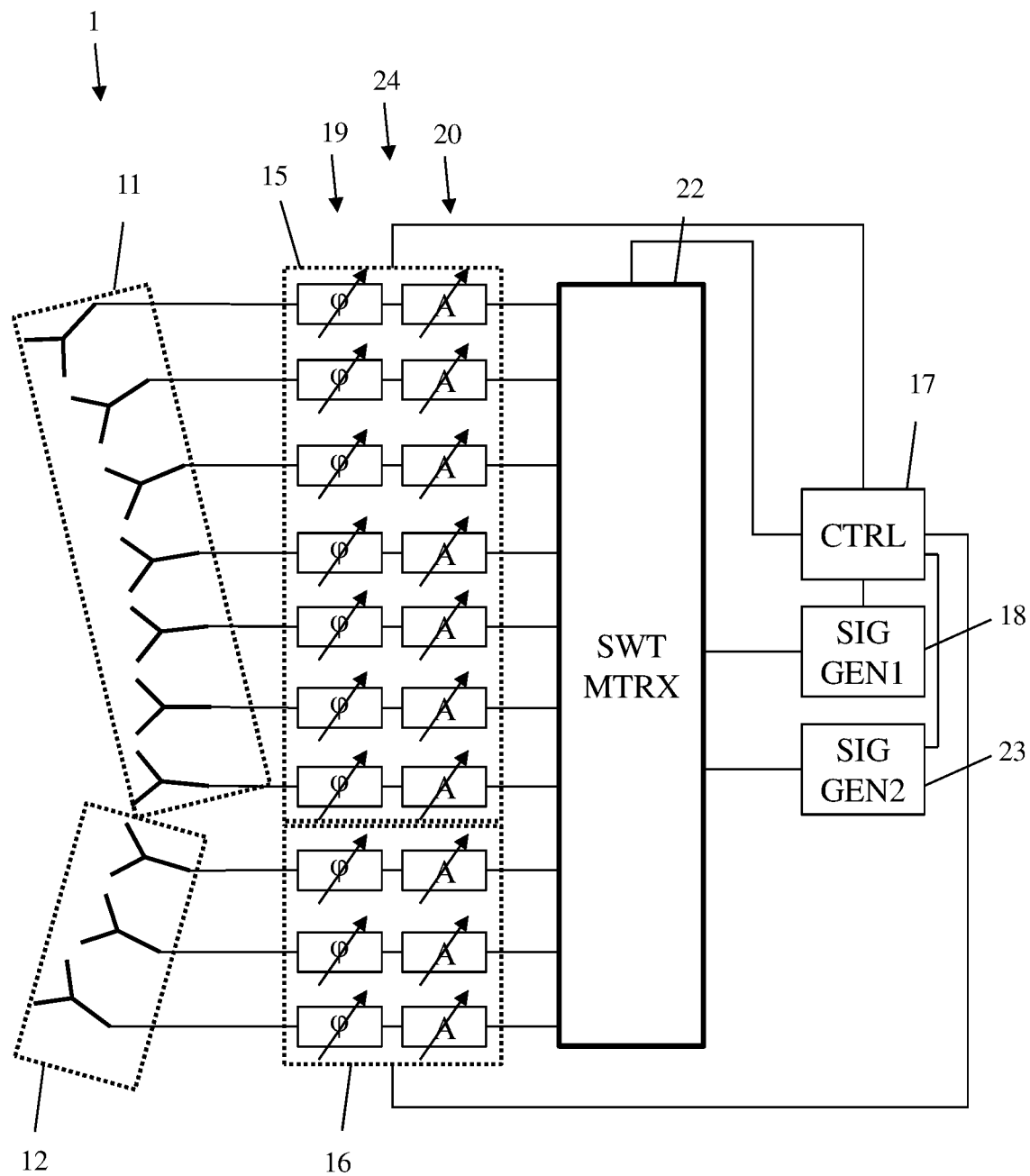
FIG. 3 shows a third embodiment of a measuring device according to the first aspect of the invention.

In FIG. 3, a further embodiment of the measuring device of the first aspect is shown. Here, the measuring device 1 additionally comprises a second signal generator 23 in addition to the first signal generator 18, already depicted in FIG. 1. Moreover, the measuring device 1 additionally comprises a switching matrix 22 which is connected between the analog signal adjusters 24 and the signal generators 18, 23. The switching matrix 22 selectively connects the individual analog signal adjusters 24 to the signal generators 18, 23. It is thereby possible to select the number of antennas within each antenna group 11, 12 and at the same time the number of analog signal adjusters 24 within each group of analog signal adjusters 15, 16. Each of the groups is supplied by a different signal generator 18, 23 with the respective measuring signal. In the example shown here, it is therefore, for example, possible to generate a first beam with a first measuring signal by the first antenna group 11 while generating a second measuring signal with a second beam by the second antenna group 12.

It is important to note that the invention is not limited to a specific number of signal generators. Also a greater number of, for example 3 or 4 or 5 signal generators can be employed. Also, more than one signal analyzer, as shown in FIG. 2 can be employed using a switching matrix as shown in FIG. 3.

Even the combined use of signal generators and signal analyzers within a single measuring device 1 using a switching matrix is possible. Then, part of the antennas can be connected to a signal generator, while another part of the antennas is connected to a signal analyzer.

Fourth Embodiment

Figure 4:
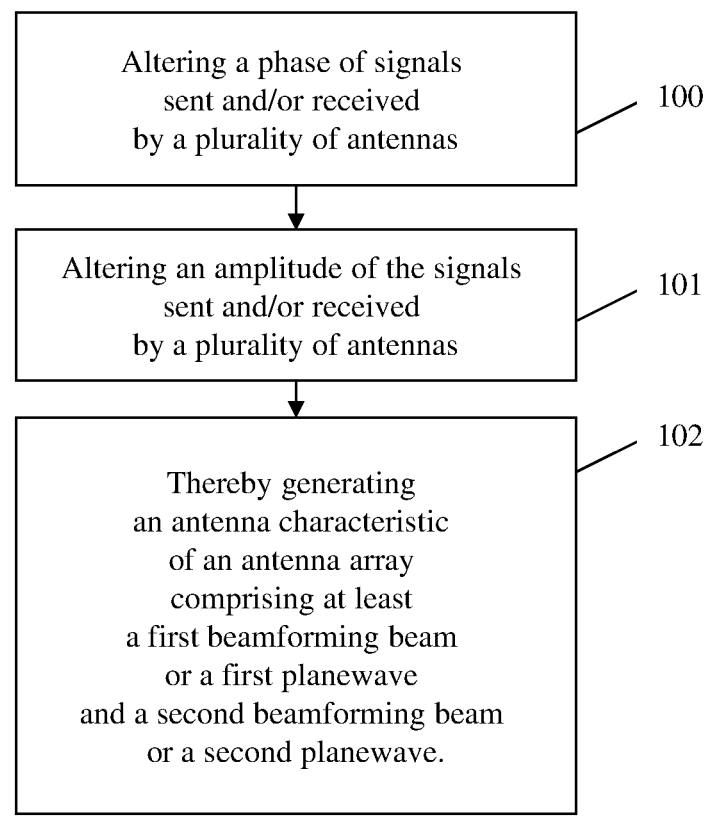
FIG. 4 shows an embodiment of the measuring method according to the second aspect of the invention.

Finally, in FIG. 4, an embodiment of an inventive measuring method is shown. In a first step 100, a phase of signals sent or received by a plurality of antennas is altered. In a second step 101, an amplitude of the signals sent or received by a plurality of antennas is altered. In a final third step 102 an antenna characteristic of an antenna array comprising at least a first beamforming beam or a first plane wave and a second beamforming beam or a second plane wave is generated.

It is important to note that the device according to the first aspect of the invention and the method according to the second aspect of the invention very closely relate, and therefore all features shown with regard to the device are also applicable with regard to the method.

The embodiments of the present invention can be implemented by hardware, software, or any combination thereof.

Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to a specific type of devices under test or a specific number of signal analyzers or signal generators.

The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

What is claimed is:

1. A measuring device comprising a plurality of analog signal adjusters, and an antenna array, comprising a plurality of antennas,
    wherein each one of the plurality of antennas of the antenna array is connected to exactly one of the plurality of analog signal adjusters,
    wherein the analog signal adjusters are adapted to alter the phase and/or amplitude of signals sent and/or received by the plurality of antennas, generating an antenna characteristic of the antenna array comprising at least a first beamforming beam or a first planewave and a second beamforming beam or a second planewave, and
    wherein the plurality of antennas emit a signal comprising the same data where the signals are shifted with regard to their phase and amplitude in order to generate the beamforming.

2. The measuring device of claim 1,
    wherein the measuring device further comprises a controller, adapted to control an amount of phase shift and/or an amount of amplitude shift generated by the analog signal adjusters.

3. The measuring device of claim 1,
    wherein the measuring device is adapted to hold a device under test at a position with regard to the antenna array, in which the device under test is in a near field of the antenna array, and
    wherein the analog signal adjusters are adapted to adjust the phase and/or amplitude of the signals sent and/or received by the plurality of antennas, so that the device under test experiences far field conditions with regard to the antenna array.

4. The measuring device of claim 1,
    wherein a first group of analog signal adjusters of the plurality of analog signal adjusters forms a first power distribution network,
    wherein the first power distribution network is adapted to adjust the phases and/or amplitudes in order to generate the first beamforming beam or first planewave,
    wherein a second group of analog signal adjusters of the plurality of analog signal adjusters forms a second power distribution network, and
    wherein the second power distribution network is adapted to adjust the phases and/or amplitudes in order to generate the second beamforming beam or second planewave.

5. The measuring device of claim 1,
    wherein the measuring device comprises a first signal generator,
    wherein the first signal generator is adapted to generate a first measuring signal, and supply it to the plurality of analog signal adjusters,
    wherein the analog signal adjusters are adapted to alter the phases and/or amplitudes of the first measuring signal, generating a transmission antenna characteristic of the antenna array comprising at least the first beamforming beam or first planewave and the second beamforming beam or the second planewave.

6. The measuring device of claim 1,
    wherein the measuring device comprises a first signal generator and a second signal generator,
    wherein the first signal generator is adapted to generate a first measuring signal, and supply it to a first group of analog signal adjusters of the plurality of analog signal adjusters,
    wherein the second signal generator is adapted to generate a second measuring signal, and supply it to a second group of analog signal adjusters of the plurality of analog signal adjusters,
    wherein the first group of analog signal adjusters is adapted to alter the phases and/or amplitudes of the first measuring signal, generating a transmission antenna characteristic of the antenna array comprising at least the first beamforming beam or the first planewave, and
    wherein the second group of analog signal adjusters is adapted to alter the phases and/or amplitudes of the second measuring signal, generating a transmission antenna characteristic of the antenna array comprising at least the second beamforming beam or the second planewave.

7. The measuring device of claim 1,
    wherein the measuring device comprises a first signal analyzer,
    wherein the first signal analyzer is adapted to measure a first measuring signal, supplied to it by the plurality of analog signal adjusters,
    wherein the analog signal adjusters are adapted to alter the phases and/or amplitudes of the first measuring signal, generating a reception antenna characteristic of the antenna array comprising at least the first beamforming beam or first planewave and the second beamforming beam or the second planewave.

8. The measuring device of claim 1,
    wherein the measuring device comprises a first signal analyzer and a second signal analyzer,
    wherein the first signal analyzer is adapted to measure a first measuring signal, provided to it by a first group of analog signal adjusters of the plurality of analog signal adjusters,
    wherein the second signal analyzer is adapted to measure a second measuring signal, provided to it by a second group of analog signal adjusters of the plurality of analog signal adjusters,
    wherein the first group of analog signal adjusters is adapted to alter the phases and/or amplitudes of the first measuring signal, generating a reception antenna characteristic of the antenna array comprising at least the first beamforming beam or the first planewave, and wherein the second group of analog signal adjusters is adapted to alter the phases and/or amplitudes of the second measuring signal, generating a reception antenna characteristic of the antenna array comprising at least the second beamforming beam or the second planewave.

9. The measuring device of claim 1,
wherein the measuring device comprises
a first signal generator and a second signal generator, or
a first signal analyzer and a second signal analyzer, and
wherein the measuring device comprises a switching matrix, connected to the plurality of signal adjusters, and to
the first signal generator and the second signal generator, if the measuring device comprises the first signal generator and the second signal generator, or to
the first signal analyzer and the second signal analyzer, if the measuring device comprises the first signal analyzer and the second signal analyzer.

10. The measuring device of claim 9,
wherein the switching matrix is adapted to connect
a first group of analog signal adjusters of the plurality of analog signal adjusters to the first signal generator, and a second group of analog signal adjusters of the plurality of analog signal adjusters to the second signal generator, if the measuring device comprises the first signal generator and the second signal generator, or
the first group of analog signal adjusters of the plurality of analog signal adjusters to the first signal analyzer, and the second group of analog signal adjusters of the plurality of analog signal adjusters to the second signal analyzer, if the measuring device comprises the first signal analyzer and the second signal analyzer.

11. The measuring device of claim 10,
wherein the switching matrix is adapted to selectively adjust a number of analog signal adjusters within the first group of analog signal adjusters, and
wherein the switching matrix is adapted to selectively adjust a number of analog signal adjusters within the second group of analog signal adjusters.

12. The measuring device of claim 1,
wherein the measuring device comprises
a first signal generator, a second signal generator, and a third signal generator, or
a first signal analyzer, a second signal analyzer, and a third signal analyzer, and
wherein the measuring device comprises a switching matrix, connected to the plurality of signal adjusters, and to
the first signal generator, the second signal generator, and the third signal generator, if the measuring device comprises the first signal generator, the second signal generator and the third signal generator, or to
the first signal analyzer, the second signal analyzer, and the third signal analyzer, if the measuring device comprises the first signal analyzer, the second signal analyzer, and the third signal analyzer.

13. The measuring device of claim 11,
wherein the switching matrix is adapted to connect
a first group of analog signal adjusters of the plurality of analog signal adjusters to the first signal generator, a second group of analog signal adjusters of the plurality of analog signal adjusters to the second signal generator, and a third group of analog signal adjusters of the plurality of analog signal adjusters to the third signal generator, if the measuring device comprises the first signal generator, the second signal generator, and the third signal generator, or
the first group of analog signal adjusters of the plurality of analog signal adjusters to the first signal analyzer, the second group of analog signal adjusters of the plurality of analog signal adjusters to the second signal analyzer, and the third group of analog signal adjusters of the plurality of analog signal adjusters to the third signal analyzer, if the measuring device comprises the first signal analyzer, the second signal analyzer, and the third signal analyzer.

14. The measuring device of claim 13,
wherein the switching matrix is adapted to selectively adjust a number of analog signal adjusters within the first group of analog signal adjusters,
wherein the switching matrix is adapted to selectively adjust a number of analog signal adjusters within the second group of analog signal adjusters, and
wherein the switching matrix is adapted to selectively adjust a number of analog signal adjusters within the third group of analog signal adjusters.

15. The measuring device of claim 1,
wherein the analog signal adjusters each comprise
an analog phase adjuster, adapted to adapt the phase of a signal, and/or
an analog amplitude adjuster, adapted to adjust an amplitude of a signal.

16. The measuring device of claim 1,
wherein the analog phase adjusters are micromechanical devices, each adapted to adjust a physical length of transmission line, and/or
wherein the analog amplitude adjusters are micromechanically adjustable attenuators.

* * * * *